(12) United States Patent
Nguyen et al.

(10) Patent No.: US 9,633,824 B2
(45) Date of Patent: Apr. 25, 2017

(54) TARGET FOR PVD SPUTTERING SYSTEM

(71) Applicant: APPLIED MATERIAL, INC., Santa Clara, CA (US)

(72) Inventors: Thanh X. Nguyen, San Jose, CA (US); Yong Cao, San Jose, CA (US); Muhammad Rasheed, San Jose, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 75 days.

(21) Appl. No.: 13/785,866

(22) Filed: Mar. 5, 2013

(65) Prior Publication Data
US 2014/0251217 A1 Sep. 11, 2014

(51) Int. Cl.
*C23C 14/34* (2006.01)
*H01J 37/34* (2006.01)
*H01J 37/32* (2006.01)

(52) U.S. Cl.
CPC ...... *H01J 37/3423* (2013.01); *C23C 14/3407* (2013.01); *H01J 37/32403* (2013.01); *H01J 37/3414* (2013.01); *H01J 37/3417* (2013.01); *H01J 37/3435* (2013.01); *Y10T 428/21* (2015.01)

(58) Field of Classification Search
USPC .......................... 204/298.12, 298.19, 298.18
See application file for complete search history.

(56) References Cited

U.S. PATENT DOCUMENTS

| 4,414,247 | A | * | 11/1983 | Hubecker et al. ............. 427/230 |
| 5,658,442 | A | * | 8/1997 | Van Gogh et al. ...... 204/298.12 |
| 5,690,795 | A | | 11/1997 | Rosenstein et al. |
| 5,824,197 | A | | 10/1998 | Tanaka |
| 6,013,159 | A | | 1/2000 | Adams et al. |
| 6,149,776 | A | * | 11/2000 | Tang et al. ............... 204/192.12 |
| 6,416,634 | B1 | | 7/2002 | Mostovoy et al. |
| 7,618,520 | B2 | | 11/2009 | Wu et al. |

(Continued)

FOREIGN PATENT DOCUMENTS

| JP | 08-053757 A | 2/1996 |
| JP | 2001-059168 A | 3/2001 |

(Continued)

OTHER PUBLICATIONS

U.S. Appl. No. 14/182,831, Feb. 18, 2014, Riker et al.

(Continued)

*Primary Examiner* — Jason M Berman
(74) *Attorney, Agent, or Firm* — Moser Taboada; Alan Taboada

(57) ABSTRACT

Embodiments of apparatus for physical vapor deposition are provided. In some embodiments, a target assembly for use in a substrate processing system to process a substrate includes a plate having a first side and an opposing second side, wherein the second side comprises a target supporting surface extending from the second side in a direction normal to the second side, wherein the target supporting surface has a first diameter and is bounded by a first edge; and a target having a first side bonded to the target supporting surface, wherein a diameter of the target is greater than the first diameter of the target supporting surface.

18 Claims, 2 Drawing Sheets

(56) References Cited

U.S. PATENT DOCUMENTS

| | | |
|---|---|---|
| 8,702,918 B2 | 4/2014 | Ritchie et al. |
| 2002/0162741 A1 | 11/2002 | Gogh |
| 2003/0217913 A1 | 11/2003 | Hong et al. |
| 2005/0133361 A1 | 6/2005 | Ding et al. |
| 2005/0170263 A1* | 8/2005 | Mitsui et al. ............ 430/5 |
| 2007/0102286 A1 | 5/2007 | Scheible et al. |
| 2008/0178801 A1 | 7/2008 | Pavloff et al. |
| 2008/0271997 A1 | 11/2008 | Facey et al. |
| 2010/0055298 A1 | 3/2010 | Sommers et al. |
| 2010/0252416 A1* | 10/2010 | Liu et al. ............ 204/192.12 |
| 2010/0288728 A1 | 11/2010 | Han et al. |
| 2011/0278165 A1 | 11/2011 | Rasheed et al. |
| 2013/0256128 A1 | 10/2013 | Ritchie et al. |

FOREIGN PATENT DOCUMENTS

| | | |
|---|---|---|
| KR | 10-2002-0001354 A | 1/2002 |
| KR | 10-2005-0069452 A | 7/2005 |

OTHER PUBLICATIONS

International Search Report and Written Opinion mailed Jan. 4, 2011 for PCT Application No. PCT/US2011/036395.
International Search Report and Written Opinion mailed Jul. 17, 2013 for PCT Application No. PCT/US2013/033337.
International Search Report and Written Opinion mailed Jun. 9, 2014 for PCT Application No. PCT/US2014/019029.

* cited by examiner

TARGET FOR PVD SPUTTERING SYSTEM

FIELD

Embodiments of the present invention generally relates to physical vapor deposition processing equipment.

BACKGROUND

In a physical vapor deposition (PVD) chamber, a dark space region exists between a powered electrode, such as the sputtering target, and a grounded shield (also referred to as a dark space shield) disposed proximate the target's edge. In an existing PVD chamber, the dark space shield is typically mounted to the main body of the PVD chamber and the target is typically mounted on a lid of the PVD chamber. The inventors have discovered that the distance between the target and the dark space shield is important in controlling any plasma irregularity and arc events, which may negatively affect the quality of deposition in the PVD chamber.

Accordingly, the inventors have provided improved apparatus for PVD processing.

SUMMARY

Embodiments of apparatus for physical vapor deposition are provided. In some embodiments, a target assembly for use in a substrate processing system to process a substrate includes a plate having a first side and an opposing second side, wherein the second side comprises a target supporting surface extending from the second side in a direction normal to the second side, wherein the target supporting surface has a first diameter and is bounded by a first edge; and a target having a first side bonded to the target supporting surface, wherein a diameter of the target is greater than the first diameter of the target supporting surface.

In some embodiments, a substrate processing apparatus includes a chamber body having a substrate support disposed therein; a power source coupled to the chamber body to form a plasma within the chamber body; a target assembly coupled to the chamber body opposite the substrate support; and a dark space shield having an inner wall disposed about an outer edge of a target of the target assembly, wherein the inner wall of the dark space shield and the outer edge of the target define a gap between the outer edge of the target and the inner wall of the dark space shield having a distance of about 0.040 to about 0.090 inches. The target assembly includes a plate having a first side and an opposing second side, wherein the second side comprises a target supporting surface extending from the second side in a direction normal to the second side, wherein the target supporting surface has a first diameter and is bounded by a first edge and a groove disposed along an outer periphery of the second side; and a target having a first side bonded to the target supporting surface and an opposing second side facing the substrate support, and wherein a diameter of the target is greater than the first diameter of the target supporting surface.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
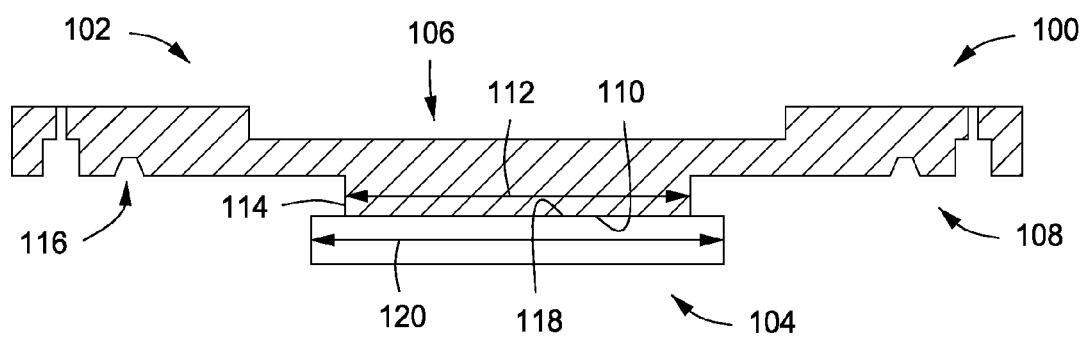
FIG. 1 depicts a target assembly in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for improved physical vapor deposition (PVD) processing equipment are provided herein. The present invention provides improved target assembly designs that may be utilized with a range of RF frequencies and/or source materials for sputter deposition in a PVD chamber. Embodiments of the target assembly of the present invention may advantageously reduce or prevent arcing between the target material and the dark space shield and improve wafer deposition symmetry by providing improved spacing between the dark space shield and the target material.

FIG. 1 depicts a target assembly 100 in accordance with some embodiments of the present invention. The target assembly 100 comprises a plate 102 and a target 104 mounted to the plate 102. The plate 102 comprises a first side 106 and an opposing second side 108. In some embodiments, the plate 102 may comprise a conductive material, such as copper-zinc, copper-chrome, or the same material as the target 104, such that RF and DC power can be coupled to the target 104 via the plate 102. Alternatively, the plate 102 may be non-conductive and may include conductive elements (not shown) such as electrical feedthroughs or the like. The plate 102 may also improve the structural stability of the target 104.

The second side 108 of the plate comprises a target supporting surface 110 extending from the second side 108 in a direction normal to the second side 108. The target supporting surface 110 has a first diameter 112 and is bounded by a first edge 114. The first diameter 112 will vary dependent upon the size of the target to be supported. For example, the first diameter 112 of the target supporting surface 110 is about 1% to about 3% smaller than the diameter of the target (i.e., about 97 to about 99 percent of the target diameter). In some embodiments, the first diameter 112 of the target supporting surface 110 has a diameter of about 17.38 to about 17.58 inches. In some embodiments, the first diameter 112 of the target supporting surface 110 is about 17.488 inches.

The target 104 is mounted to the target supporting surface 110. In some embodiments, the target supporting surface 110 may be grit blasted to improve adhesion of the target 104 to the target supporting surface 110. The target 104 may be a material to be deposited on the substrate during sputtering, such as a metal or metal oxide. In some embodiments, the target 104 may be a material such as aluminum, silicon, niobium, tantalum, titanium, cobalt, copper or the like. In some embodiments, the thickness of the target 104 is about 0.1 inches to about 0.35 inches. In some embodiments, the thickness of the target 104 is about 0.25 inches. In some embodiments, the target 104 is diffusion bonded to the target supporting surface 110.

The target 104 has a first side 118 bonded to the target supporting surface 110. A diameter 120 of the target 104 is greater than the first diameter 112 of the target supporting surface 110. In some embodiments, the diameter of the target 104 is about 17.4 to about 17.6 inches, although other target sizes may be used. In some embodiments, the diameter of the target is about 17.508 inches.

Figure 2:
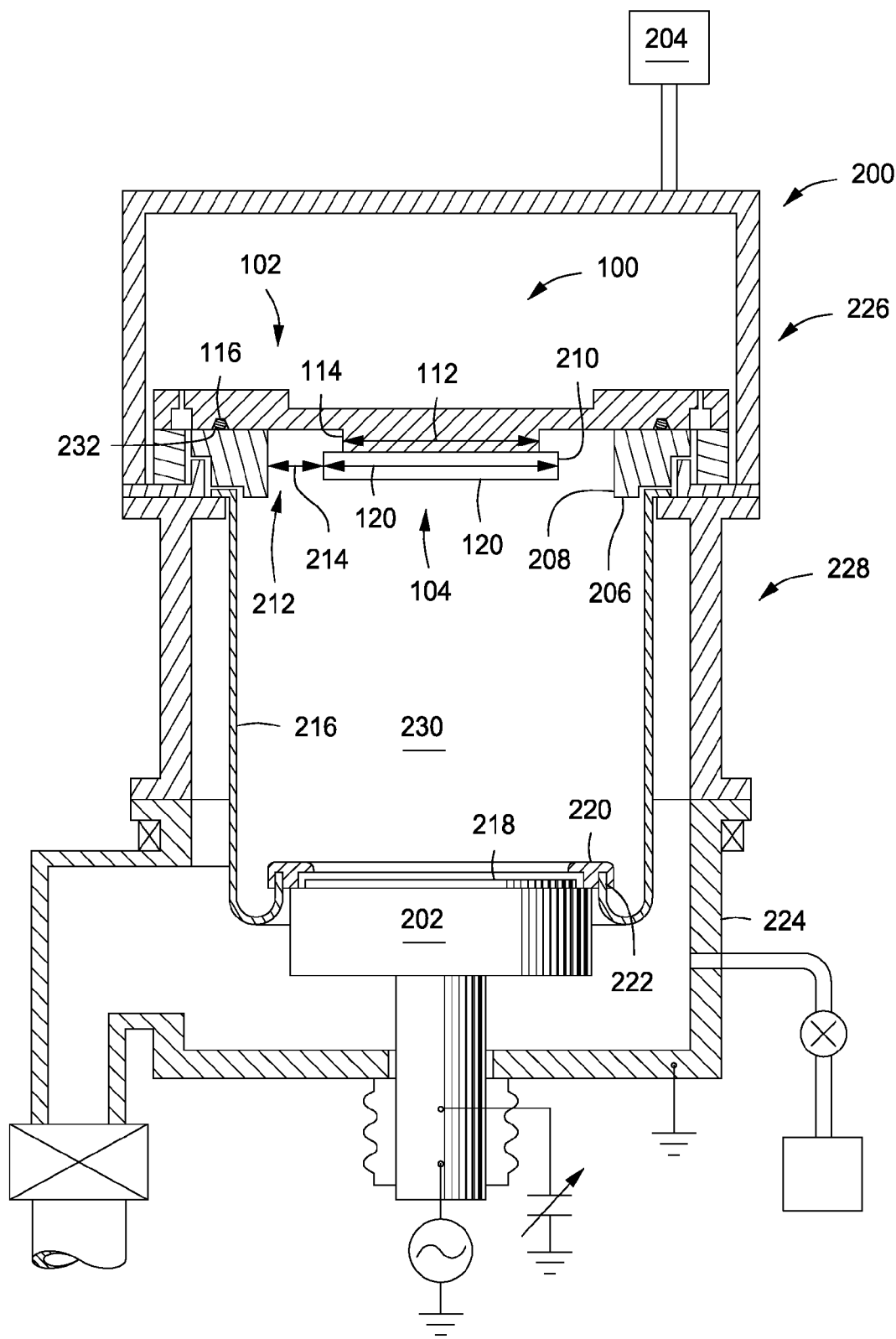
FIG. 2 depicts a schematic view of a process chamber in accordance with some embodiments of the present invention.

A groove 116 is disposed along an outer periphery of the second side of the plate 102. A seal 226 (depicted in FIG. 2) is disposed in the groove 116 to create a seal between the plate 102 and an opposing surface to which the plate 102 is mounted (e.g., as depicted in FIG. 2). In some embodiments, the groove 116 comprises a surface textured with silicon carbide. In some embodiments, the surface of the groove 116 has a surface roughness of about 200 to about 300 microns.

FIG. 2 depicts a schematic, cross-sectional view of a physical vapor deposition chamber, or process chamber 200, in accordance with some embodiments of the present invention. Examples of suitable PVD chambers include the ENDURA® PVD processing chamber, commercially available from Applied Materials, Inc., of Santa Clara, Calif. Other processing chambers from Applied Materials, Inc. or other manufactures may also benefit from the inventive apparatus disclosed herein.

In some embodiments, the process chamber 200 has a chamber lid 226 disposed atop a chamber body 228. The chamber body 228 has an inner volume 230. The process chamber 200 further comprises a process shield 216, disposed within the inner volume 230 of the chamber body 228 and below the target assembly 100. The process shield 216 prevents deposition of sputtered target material onto the sidewalls of the chamber body 228. In some embodiments, the process shield 216 is made of a conductive material, such as stainless steel, aluminum, or the like.

The chamber body 228 also contains a substrate support pedestal 202 for receiving a substrate 218 thereon. The substrate support pedestal 202 may be located within a grounded enclosure wall 224, which may be a chamber wall (as shown) or a grounded shield.

The process shield 216 extends along the walls of the chamber body 228 downwardly to below a top surface of the substrate support pedestal 202 and returns upwardly until reaching a top surface of the substrate support pedestal 202. A cover ring 220 rests on the top of the upwardly extending inner portion 222 of the process shield 216 when the substrate support pedestal 202 is in its lower, loading position but rests on the outer periphery of the substrate support pedestal 202 when it is in its upper, deposition position to protect the substrate support pedestal 202 from sputter deposition.

The chamber lid 226 can be removed from the chamber body 228, for example, to install or replace a target assembly 100 or for performing maintenance on the process chamber 200. In some embodiments, the chamber lid 226 includes a target assembly 100 as described above and a dark space shield 206. In some embodiments, a power source 204 is coupled to the chamber lid 226 to couple RF and, optionally, DC power to the target.

A dark space shield 206, having an inner wall 208, is generally disposed about an outer edge 210 of the target 104. In some embodiments, the dark space shield 206 is made of a dielectric material, such as ceramic. The inner wall 208 of the dark space shield 206 and the outer edge 210 of the target 104 define a gap 212 between the outer edge 210 of the target 104 and the inner wall 208 of the dark space shield 206 having a distance 214 of about 0.040 to about 0.090 inches. The distance 214 between the outer edge 210 of the target 104 and the inner wall 208 of the dark space shield 206 advantageously reduces arcing and enhances uniformity of the deposition process by preventing plasma formation within the gap 212. This distance 214 also advantageously prevents re-sputtering within the gap 212.

The chamber body 228 contains a substrate support pedestal 202 for receiving a substrate 218 thereon. The substrate support pedestal 202 may be located within a grounded enclosure wall 224, which may be a chamber wall (as shown) or a grounded shield.

The process shield 216 extends along the walls of the chamber body 228 downwardly to below a top surface of the substrate support pedestal 202 and returns upwardly until reaching a top surface of the substrate support pedestal 202. A cover ring 220 rests on the top of the upwardly extending inner portion 222 of the process shield 216 when the substrate support pedestal 202 is in its lower, loading position but rests on the outer periphery of the substrate support pedestal 202 when it is in its upper, deposition position to protect the substrate support pedestal 202 from sputter deposition.

While the foregoing is directed to embodiments of the present invention, other and further embodiments of the invention may be devised without departing from the basic scope thereof.

The invention claimed is:

1. A substrate processing apparatus, comprising:
   a chamber body having a substrate support disposed therein;
   a power source coupled to the chamber body to form a plasma within the chamber body;
   a target assembly coupled to the chamber body opposite the substrate support, wherein the target assembly comprises;
      a plate having a first side and an opposing second side, wherein the second side comprises a target supporting surface extending from the second side in a direction normal to the second side, wherein the target supporting surface has a first diameter measured at an interface of the target and the target supporting surface and is bounded by a first edge and a groove disposed along an outer periphery of the second side; and
      a target having a first side bonded to the target supporting surface and an opposing second side facing the substrate support, and wherein the first diameter of the target supporting surface is about 97 to about 99 percent of the diameter of the target measured at the interface of the target and the target supporting surface, and wherein the second side of the target is disposed parallel to the substrate support; and
   a dark space shield having an inner wall disposed about an outer edge of the target, wherein the inner wall of the dark space shield and the outer edge of the target define a gap between the outer edge of the target and the inner wall of the dark space shield having a distance of about 0.040 to about 0.090 inches.

2. The apparatus of claim 1, wherein the target is one of tantalum, titanium, cobalt, copper, aluminum, silicon, or niobium.

3. The apparatus of claim 1, wherein the thickness of the target is about 0.10 to about 0.35 inches.

4. The apparatus of claim 1, further comprising a groove disposed along an outer periphery of the second side and a seal disposed in the groove.

5. The apparatus of claim 4, wherein the groove further comprises a surface textured with silicon carbide.

6. The apparatus of claim 5, wherein the surface of the groove further comprises a surface roughness of about 200 to about 300 microns.

7. The apparatus of claim 1, wherein the power source is a DC power source.

8. The apparatus of claim 1, wherein the power source is an RF power source.

9. The apparatus of claim 1, wherein the diameter of the target is between about 17.40 to about 17.60 inches.

10. The apparatus of claim 1, wherein the first diameter of the target supporting surface is about 17.38 to about 17.58 inches.

11. A substrate processing apparatus, comprising:
   a chamber body having a substrate support disposed therein;
   a power source coupled to the chamber body to form a plasma within the chamber body;
   a target assembly coupled to the chamber body opposite the substrate support, wherein the target assembly comprises;
      a plate having a first side and an opposing second side, wherein the second side comprises a target supporting surface extending from the second side in a direction normal to the second side, wherein the target supporting surface has a first diameter measured at an interface of the target and the target supporting surface and is bounded by a first edge and a groove disposed along an outer periphery of the second side; and
      a target having a first side bonded to the target supporting surface and an opposing second side facing the substrate support, and wherein the first diameter of the target supporting surface is about 97 to about 99 percent of the diameter of the target measured at the interface of the target and the target supporting surface, and wherein the second side of the target is disposed parallel to the substrate support.

12. The apparatus of claim 11, wherein the target is one of tantalum, titanium, cobalt, copper, aluminum, silicon, or niobium.

13. The apparatus of claim 11, wherein the thickness of the target is about 0.10 to about 0.35 inches.

14. The apparatus of claim 11, further comprising a seal disposed in the groove.

15. The apparatus of claim 14, wherein the groove further comprises a surface textured with silicon carbide.

16. The apparatus of claim 15, wherein the surface of the groove further comprises a surface roughness of about 200 to about 300 microns.

17. The apparatus of claim 11, wherein the diameter of the target is about 17.40 to about 17.60 inches.

18. The apparatus of claim 11, wherein the first diameter of the target supporting surface is about 17.38 to about 17.58 inches.

* * * * *